US012666715B2

(12) United States Patent
Hsu et al.

(10) Patent No.: US 12,666,715 B2
(45) Date of Patent: Jun. 23, 2026

(54) THIN FILM TRANSISTOR ARRAY SUBSTRATE AND MANUFACTURING METHOD THEREOF

(71) Applicant: E Ink Holdings Inc., Hsinchu (TW)

(72) Inventors: Ting-Yu Hsu, Hsinchu (TW); Wei-Tsung Chen, Hsinchu (TW)

(73) Assignee: E Ink Holdings Inc., Hsinchu (TW)

( * ) Notice: Subject to any disclaimer, the term of this patent is extended or adjusted under 35 U.S.C. 154(b) by 461 days.

(21) Appl. No.: 18/300,404

(22) Filed: Apr. 14, 2023

(65) Prior Publication Data

US 2023/0387133 A1 Nov. 30, 2023

(30) Foreign Application Priority Data

May 24, 2022 (TW) ................................... 111119201

(51) Int. Cl.
*H10D 86/01* (2026.01)
*H10D 86/40* (2025.01)

(52) U.S. Cl.
CPC ....... *H10D 86/0231* (2025.01); *H10D 86/481* (2025.01)

(58) Field of Classification Search
CPC ................................................. H10D 86/0231
See application file for complete search history.

(56) References Cited

U.S. PATENT DOCUMENTS 9,123,691 B2 9/2015 Wang et al.
2002/0052058 A1 * 5/2002 Tseng ................. H10D 86/0231
438/30

2004/0125280 A1 7/2004 Kim et al.
2008/0251789 A1 10/2008 Chen
2009/0251653 A1 * 10/2009 Hayashi ............. H10D 86/0231
349/139

(Continued)

FOREIGN PATENT DOCUMENTS

CN 1728351 A 2/2006
CN 101079429 A 11/2007

(Continued)

OTHER PUBLICATIONS

The office action of corresponding TW application No. 111119201 issued on Feb. 6, 2023.

(Continued)

*Primary Examiner* — Peter M Albrecht

(74) *Attorney, Agent, or Firm* — CKC & Partners Co., LLC

(57) ABSTRACT

A TFT array substrate includes a bottom plate, a first metal layer, an insulating layer, a semiconductor layer, a second metal layer, and a transparent electrode layer. The first metal layer is located on the bottom plate. The insulating layer covers the bottom plate and the first metal layer. The semiconductor layer is located on the insulating layer and overlaps a first portion of the first metal layer. The second metal layer has a first portion on the semiconductor layer and a second portion on the insulating layer, and the second portion of the second metal layer overlaps a second portion of the first metal layer. A first portion of the transparent electrode layer is disposed along the first portion of the second metal layer, and a second portion of the transparent electrode layer is disposed along the second portion of the second metal layer.

9 Claims, 8 Drawing Sheets

100

(56) References Cited

U.S. PATENT DOCUMENTS

2018/0194105 A1\*  7/2018  Hayakawa  .............. C23C 14/34

FOREIGN PATENT DOCUMENTS

| CN | 100405194 | C  | 7/2008 |
| CN | 107482018 | A  | 12/2017 |
| CN | 105452949 | B  | 2/2019 |
| KR | 20040050235 | A | 6/2004 |
| KR | 20050042988 | A | 5/2005 |
| TW | 200816485 | A  | 4/2008 |
| TW | 200832696 | A  | 8/2008 |
| TW | 200841472 | A  | 10/2008 |
| WO | 2013116992 | A1 | 8/2013 |
| WO | 2015100894 | A1 | 7/2015 |
| WO | 2016039211 | A1 | 3/2016 |

OTHER PUBLICATIONS

The office action of corresponding CN application No. 202210569891.7 issued on Mar. 18, 2026.

\* cited by examiner

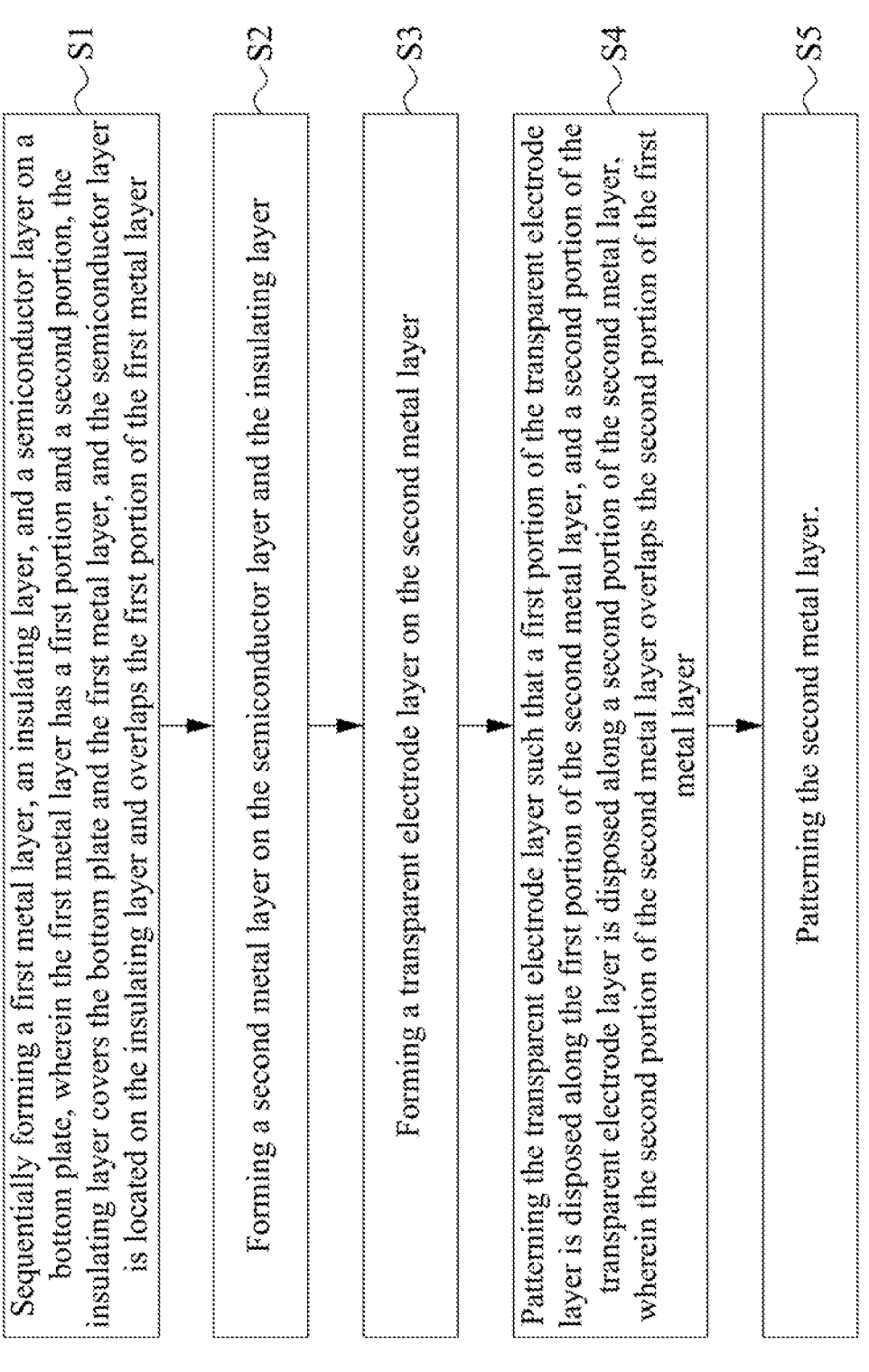

Sequentially forming a first metal layer, an insulating layer, and a semiconductor layer on a bottom plate, wherein the first metal layer has a first portion and a second portion, the insulating layer covers the bottom plate and the first metal layer, and the semiconductor layer is located on the insulating layer and overlaps the first portion of the first metal layer ～S1

Forming a second metal layer on the semiconductor layer and the insulating layer ～S2

Forming a transparent electrode layer on the second metal layer ～S3

Patterning the transparent electrode layer such that a first portion of the transparent electrode layer is disposed along the first portion of the second metal layer, and a second portion of the transparent electrode layer is disposed along a second portion of the second metal layer, wherein the second portion of the second metal layer overlaps the second portion of the first metal layer ～S4

Patterning the second metal layer. ～S5

THIN FILM TRANSISTOR ARRAY SUBSTRATE AND MANUFACTURING METHOD THEREOF

CROSS-REFERENCE TO RELATED APPLICATIONS

This application claims priority to Taiwan Application Serial Number 111119201, filed May 24, 2022, which is herein incorporated by reference.

BACKGROUND

Field of Invention

The present disclosure relates to a thin film transistor array substrate and a manufacturing method of the thin film transistor array substrate.

Description of Related Art

Generally speaking, a thin film transistor array (TFT Array) substrate used in an electronic paper display requires seven or eight photomask processes. For example, the plural photomask processes may include patterning a gate, a gate insulator, a semiconductor film, a source/drain, a passivation layer, an overcoat layer, and a transparent electrode layer, and another patterned metal layer may be formed after the formation of the overcoat layer and before the formation of the transparent electrode layer. The array function of driving an electronic ink layer can be completed through the above seven or eight photomask processes.

Therefore, it is difficult to shorten the cycle time for producing the thin film transistor array substrate, and the cost of the photomask is expensive, which is less than ideal for the electronic paper display with lower resolution requirements.

SUMMARY

One aspect of the present disclosure provides a thin film transistor (TFT) array substrate.

According to some embodiments of the present disclosure, a thin film transistor (TFT) array substrate includes a bottom plate, a first metal layer, an insulating layer, a semiconductor layer, a second metal layer, and a transparent electrode layer. The first metal layer is located on the bottom plate and has a first portion and a second portion. The insulating layer covers the bottom plate and the first metal layer. The semiconductor layer is located on the insulating layer and overlaps the first portion of the first metal layer. The second metal layer has a first portion on the semiconductor layer and a second portion on the insulating layer, and the second portion of the second metal layer overlaps the second portion of the first metal layer. The transparent electrode layer has a first portion and a second portion, wherein the first portion of the transparent electrode layer is disposed along the first portion of the second metal layer, and the second portion of the transparent electrode layer is disposed along the second portion of the second metal layer.

In some embodiments, the transparent electrode layer is in direct contact with the second metal layer.

In some embodiments, a bottom surface of the transparent electrode layer is coplanar with a top surface of the second metal layer.

In some embodiments, the transparent electrode layer extends from a top surface of the second metal layer to a sidewall of the second metal layer.

In some embodiments, the first portion of the second metal layer has two sections that are separated from each other, and each of the two sections extends from a top surface of the semiconductor layer to a top surface of the insulating layer along a sidewall of the semiconductor layer.

In some embodiments, the thin film transistor array substrate further includes a passivation layer and an overcoat layer. The passivation layer covers the insulating layer, the second metal layer, and the transparent electrode layer. The overcoat layer covers the passivation layer, wherein each of the overcoat layer and the passivation layer has an opening, and the transparent electrode layer on the second portion of the second metal layer is located in the two openings.

Another aspect of the present disclosure provides a manufacturing method of a thin film transistor (TFT) array substrate.

According to some embodiments of the present disclosure, a manufacturing method of a thin film transistor (TFT) array substrate includes sequentially forming a first metal layer, an insulating layer, and a semiconductor layer on a bottom plate, wherein the first metal layer has a first portion and a second portion, the insulating layer covers the bottom plate and the first metal layer, and the semiconductor layer is located on the insulating layer and overlaps the first portion of the first metal layer; forming a second metal layer on the semiconductor layer and the insulating layer; forming a transparent electrode layer on the second metal layer; patterning the transparent electrode layer such that a first portion of the transparent electrode layer is disposed along the first portion of the second metal layer, and a second portion of the transparent electrode layer is disposed along a second portion of the second metal layer, wherein the second portion of the second metal layer overlaps the second portion of the first metal layer; and patterning the second metal layer.

In some embodiments, patterning the transparent electrode layer includes forming a photoresist layer on the transparent electrode layer; and etching, by the photoresist layer, the transparent electrode layer.

In some embodiments, patterning the second metal layer includes etching, by the photoresist layer, the second metal layer, such that the first portion and the second portion of the second metal layer are separated from each other, the first portion of the second metal layer has two sections separated from each other, and each of the two sections extends from a top surface of the semiconductor layer to a top surface of the insulating layer along a sidewall of the semiconductor layer.

In some embodiments, the manufacturing method of the thin film transistor array substrate further includes, after etching the second metal layer by the photoresist layer, removing the photoresist layer.

In some embodiments, the manufacturing method of the thin film transistor array substrate further includes, after removing the photoresist layer, increasing a temperature to crystalize the transparent electrode layer.

In some embodiments, the manufacturing method of the thin film transistor array substrate further includes, after etching the transparent electrode layer by the photoresist layer, removing the photoresist layer.

In some embodiments, the manufacturing method of the thin film transistor array substrate further includes, after removing the photoresist layer, increasing a temperature to crystalize the transparent electrode layer.

In some embodiments, patterning the second metal layer includes etching, by the crystalized transparent electrode layer, the second metal layer, such that the first portion and the second portion of the second metal layer are separated from each other, the first portion of the second metal layer has two sections separated from each other, and each of the two sections extends from a top surface of the semiconductor layer to a top surface of the insulating layer along a sidewall of the semiconductor layer.

In some embodiments, the manufacturing method of the thin film transistor array substrate further includes forming a passivation layer to cover the insulating layer, the second metal layer, and the transparent electrode layer; and etching the passivation layer above the second portion of the second metal layer to form an opening, wherein the second portion of the transparent electrode layer is an etch stop layer.

In some embodiments, the manufacturing method of the thin film transistor array substrate further includes forming an overcoat layer to cover the passivation layer, wherein the overcoat layer has an opening, and the transparent electrode layer on the second portion of the second metal layer is located in the opening of the overcoat layer and the opening of the passivation layer.

In the aforementioned embodiments of the present disclosure, since the transparent electrode layer is formed on the second metal layer after the second metal layer is formed on the semiconductor layer and the insulating layer, the transparent electrode layer and the underlying second metal layer may be sequentially patterned by using the same photoresist layer. Alternatively, the second metal layer may be patterned by using the patterned transparent electrode layer as a mask. As a result, the first portion of the transparent electrode layer can be disposed along the first portion of the second metal layer, and the second portion of the transparent electrode layer can be disposed along the second portion of the second metal layer. A reduction of one photomask process may be realized with the manufacturing method of the thin film transistor array substrate, and moreover, the manufacturing method may be applied to an electronic paper display with lower resolution requirements. Moreover, in a subsequent process, the second portion of the transparent electrode layer may serve as an etch stop layer.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1 is a flow chart of a manufacturing method of a thin film transistor array substrate according to one embodiment of the present disclosure.

DETAILED DESCRIPTION

Figure 2:
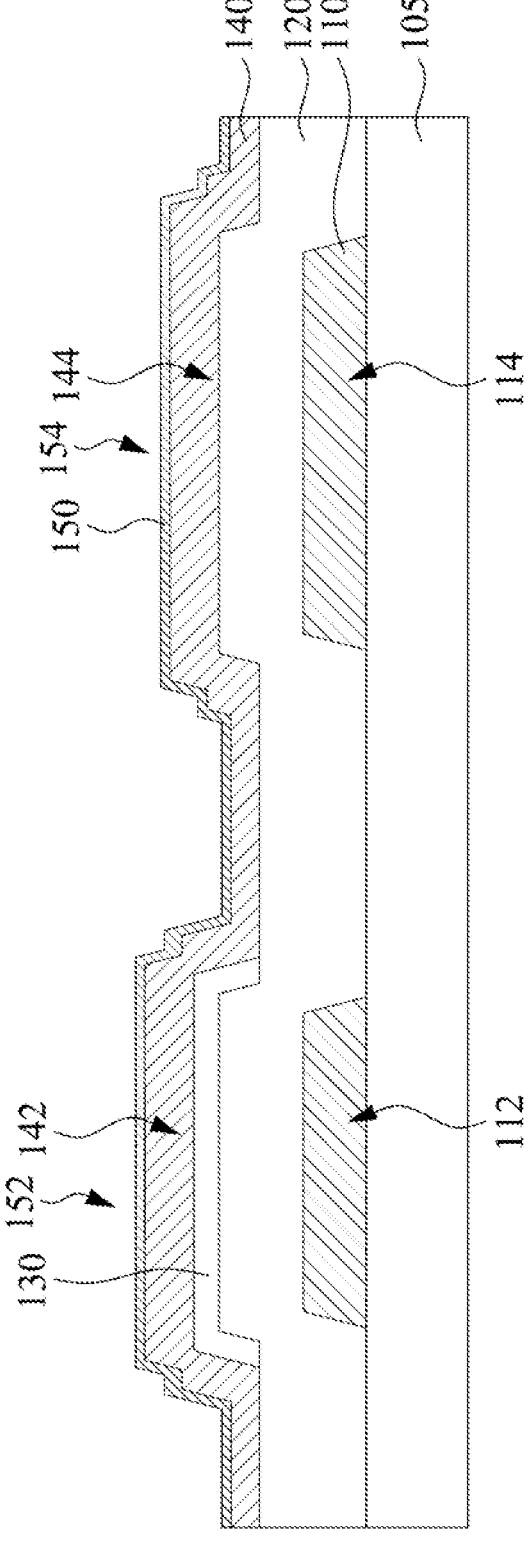
FIGS. 2 to 6 are cross-sectional views at various stages of a manufacturing method of a thin film transistor array substrate according to one embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a flow chart of a manufacturing method of a thin film transistor array substrate according to one embodiment of the present disclosure. The manufacturing method of the thin film transistor array substrate includes the steps as outlined below. In step S1, a first metal layer, an insulating layer, and a semiconductor layer are sequentially formed on a bottom plate, wherein the first metal layer has a first portion and a second portion, the insulating layer covers the bottom plate and the first metal layer, and the semiconductor layer is located on the insulating layer and overlaps the first portion of the first metal layer. Thereafter, in step S2, a second metal layer is formed on the semiconductor layer and the insulating layer. Next, in step S3, a transparent electrode layer is formed on the second metal layer. Afterwards, in step S4, the transparent electrode layer is patterned such that a first portion of the transparent electrode layer is disposed along the first portion of the second metal layer, and a second portion of the transparent electrode layer is disposed along a second portion of the second metal layer, wherein the second portion of the second metal layer overlaps the second portion of the first metal layer. Subsequently, in step S5, the second metal layer is patterned. The manufacturing method of the thin film transistor array substrate is not limited to the above steps S1 to S5. For example, in some embodiments, the manufacturing method of the thin film transistor array substrate may further include other steps between two of the above steps, before step S1, and after step S5.

In the following description, various steps of the aforementioned manufacturing method of the thin film transistor array substrate will be explained.

FIGS. 2 to 6 are cross-sectional views at various stages of a manufacturing method of a thin film transistor array substrate 100 (see FIG. 6) according to one embodiment of the present disclosure. As shown in FIG. 2, a first metal layer 110, an insulating layer 120, and a semiconductor layer 130 can be sequentially formed on a bottom plate 105. The bottom plate 105 may be a glass substrate or a plastic substrate. The first metal layer 110 and the semiconductor layer 130 may be formed through patterning, such that the first metal layer 110 has a first portion 112 and a second portion 114. In this disclosure, the patterning process may include an exposure step, a development step, an etch step, etc. The insulating layer 120 covers the bottom plate 105 and the first metal layer 110. The first portion 112 of the first metal layer 110 may act as a gate of a thin film transistor, while the insulating layer 120 may act as a gate insulator.

The semiconductor layer 130 is located on the insulating layer 120 and overlaps the first portion 112 of the first metal layer 110. Moreover, there is no semiconductor layer 130 on the insulating layer 120 that overlaps the second portion of the first metal layer 110. In some embodiments, the material of the first metal layer 110 may include aluminum or molybdenum, the material of the insulating layer 120 may include silicon nitride or silicon dioxide, the material of the semiconductor layer 130 may include amorphous silicon or indium gallium zinc oxide (IGZO), but the present disclosure is not limited in this regard.

After the formation of the semiconductor layer 130, a second metal layer 140 may be formed on the semiconductor layer 130 and the insulating layer 120. Thereafter, a transparent electrode layer 150 may be formed on the second metal layer 140. The second metal layer 140 and the transparent electrode layer 150 may be formed by deposition, such as physical vapor deposition (PVD). As a result, the transparent electrode layer 150 can be in direct contact with the second metal layer 140. In other words, the bottom surface of the transparent electrode layer 150 is coplanar with the top surface of the second metal layer 140. In some embodiments, the material of the transparent electrode layer 150 includes indium tin oxide (ITO). Furthermore, the second metal layer 140 has a first portion 142 on the semiconductor layer 130 and a second portion 144 on the insulating layer 120, the first portion 142 of the second metal layer 140 overlaps the first portion 112 of the first metal layer 110, and the second portion 144 of the second metal layer 140 overlaps the second portion 114 of the first metal layer 110.

Figure 3:
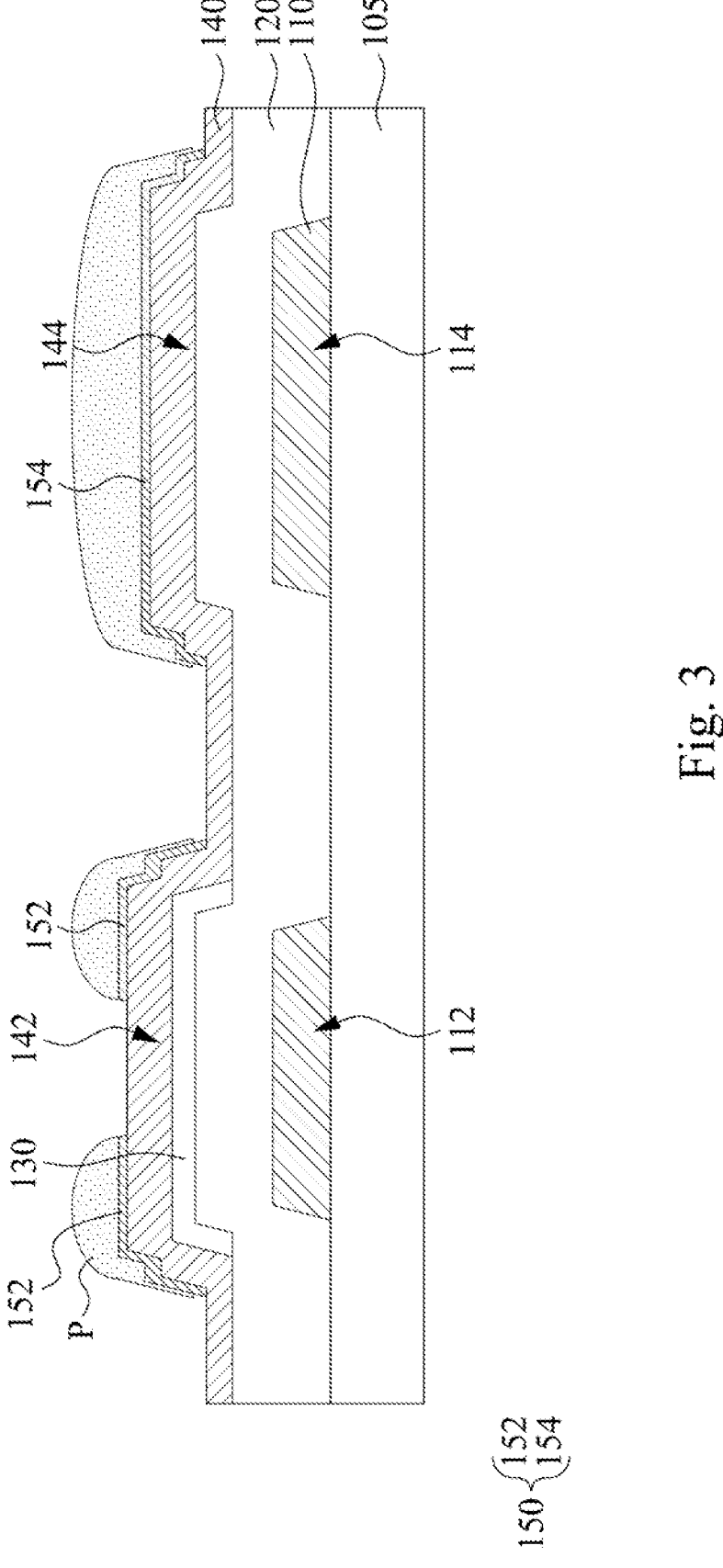

As shown in FIG. 3, after the aforementioned transparent electrode layer 150 is formed, the transparent electrode layer 150 may be patterned such that a first portion 152 of the transparent electrode layer 150 is disposed along the first portion 142 of the second metal layer 140, and a second portion 154 of the transparent electrode layer 150 is disposed along the second portion 144 of the second metal layer 140, in which the first portion 152 of the transparent electrode layer 150 forms two sections that are separated from each other. In the step of patterning the transparent electrode layer 150, the step may include forming a photoresist layer P on the transparent electrode layer 150, and the transparent electrode layer 150 is etched by using the photoresist layer P as a mask. Through this step, the second metal layer 140 that does not overlap the first metal layer 110 will be exposed, and the transparent electrode layer 150 may extend from the top surface of the second metal layer 140 to the sidewall of the second metal layer 140.

In this embodiment, since the transparent electrode layer 150 is formed on the second metal layer 140 after the second metal layer 140 is formed on the semiconductor layer 130 and the insulating layer 120, the transparent electrode layer 150 and the underlying second metal layer 140 can be sequentially patterned by using the same photoresist layer P. As a result, a reduction of one photomask process (e.g., traditional photo and etching processes for a transparent electrode can be omitted) may be realized with the manufacturing method of the thin film transistor array substrate, and moreover, the manufacturing method may be applied to an electronic paper display with lower resolution requirements.

Figure 4:
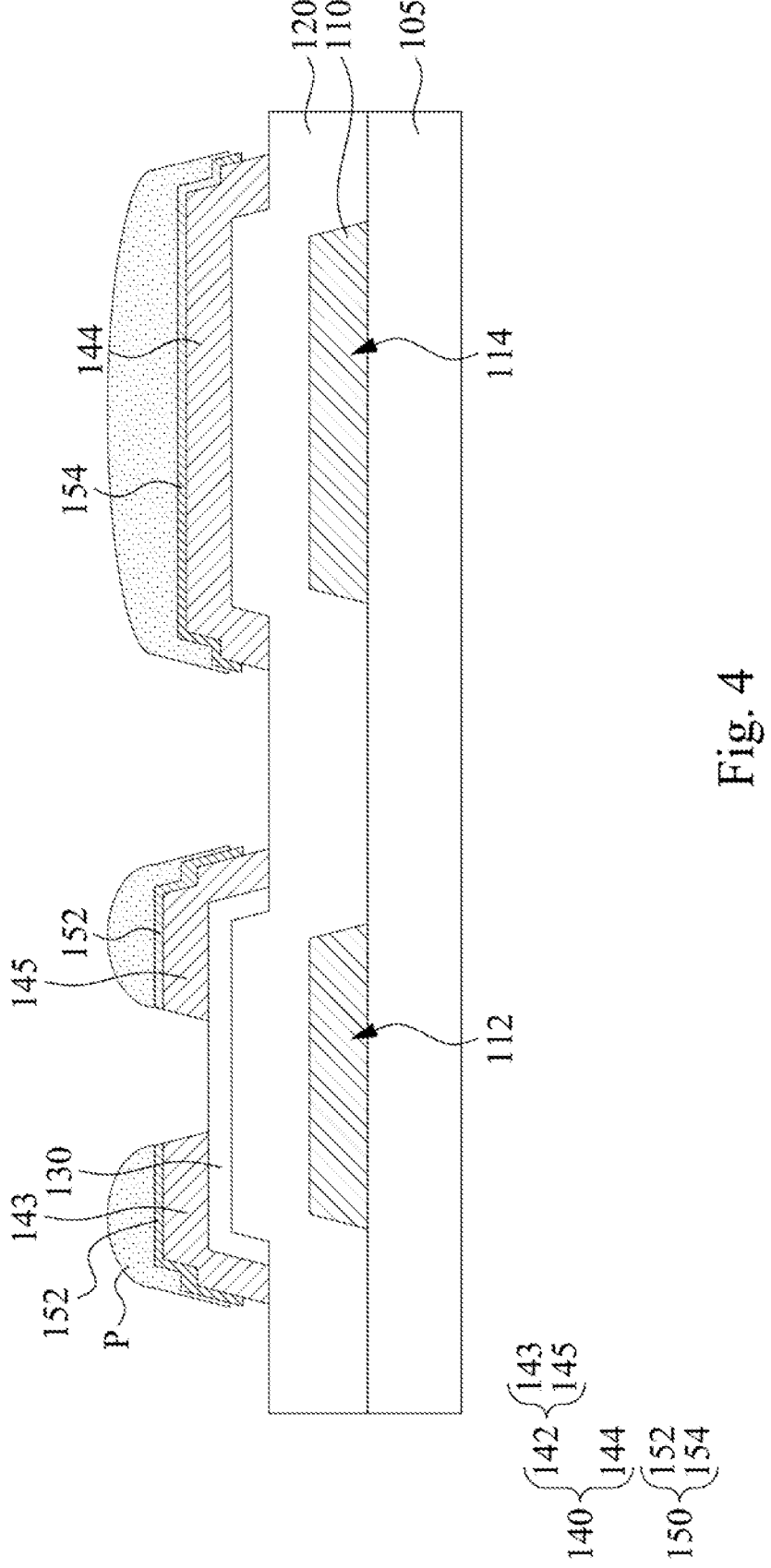

As shown in FIG. 4, after etching the transparent electrode layer 150, the photoresist layer P may be maintained to further pattern the second metal layer 140. In the step of patterning the transparent electrode layer 150, the photoresist layer P can serve as a mask, and the second metal layer

140 is etched by using the photoresist layer P, such that the first portion 142 and the second portion 144 of the second metal layer 140 are separated from each other, the first portion 142 of the second metal layer 140 has two sections 143 and 145 separated from each other, and each of the two sections 143 and 145 extends from the top surface of the semiconductor layer 130 to the top surface of the insulating layer 120 along the sidewall of the semiconductor layer 130. The two sections 143 and 145 of the first portion 142 of the second metal layer 140 may respectively act as a source region and a drain region of a thin film transistor. Through this step, the insulating layer 120 that does not overlap the first metal layer 110 will be exposed.

Figure 5:
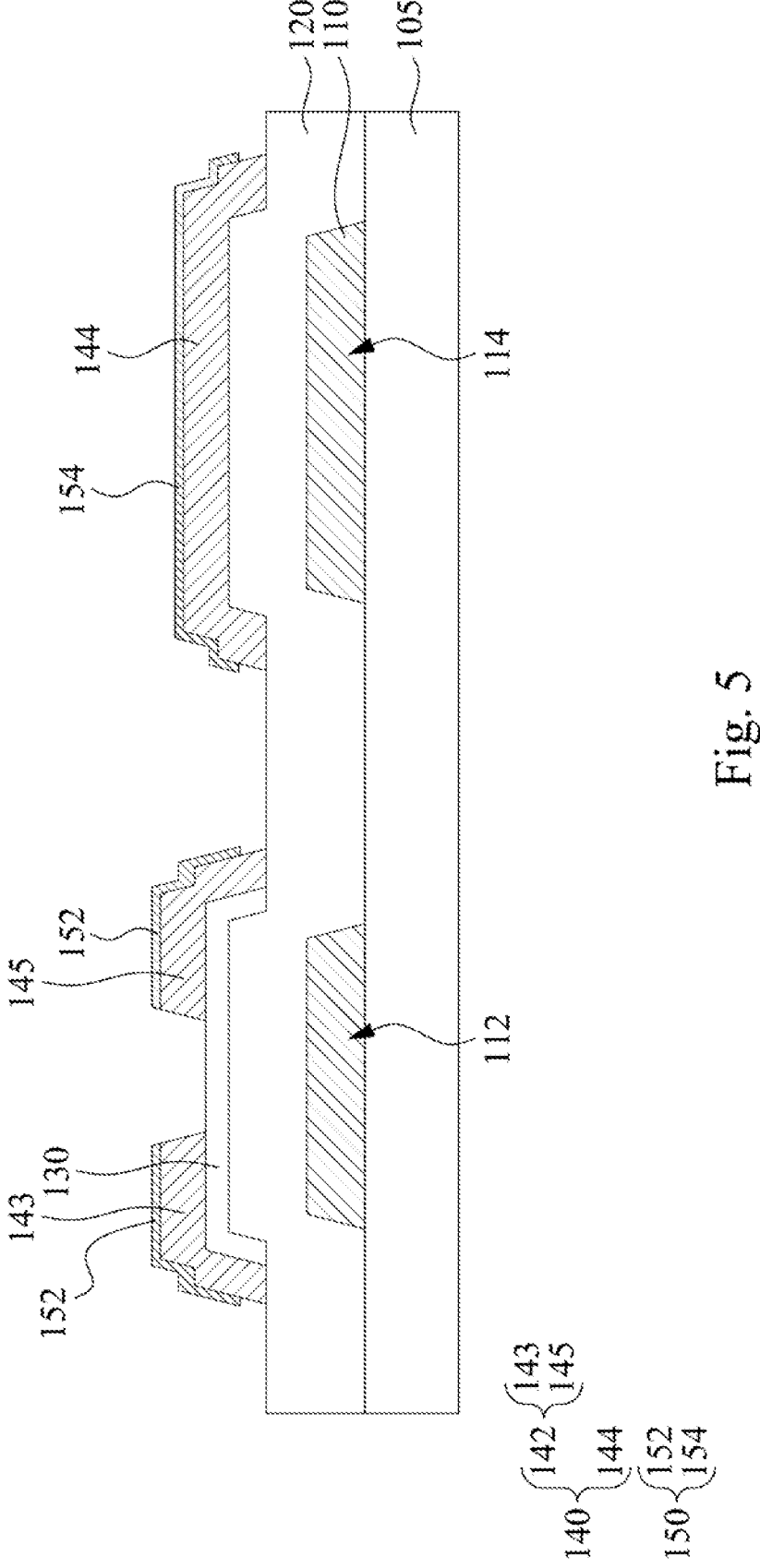

As shown in FIG. 5, after using the photoresist layer P to etch the second metal layer 140, the photoresist layer P may be removed. Thereafter, a high-temperature crystalizing step is performed. A temperature is increased to crystalize the transparent electrode layer 150, such that the transparent electrode layer 150 has etching and bombardment resistance properties. In addition, a stacked structure at the left side of FIG. 5 from the first portion 112 of the first metal layer 110 upward to the first portion 142 of the second metal layer 140 may be referred to as a thin film transistor, and another stacked structure at the right side of FIG. 5 from the second portion 114 of the first metal layer 110 upward to the second portion 144 of the second metal layer 140 may be referred to as a storage capacitor.

Figure 6:

As shown in FIG. 6, after the transparent electrode layer 150 is crystalized by a high temperature, a passivation layer 160 may be formed to cover the insulating layer 120, the second metal layer 140, and the transparent electrode layer 150. The material of the passivation layer 160 may include nitride or oxide, and may be formed by chemical vapor deposition (CVD). Thereafter, the passivation layer 160 above the second portion 144 of the second metal layer 140 can be etched to form an opening O1. Because the transparent electrode layer 150 already has the property of etching resistance, the second portion 154 of the transparent electrode layer 150 can serve as an etch stop layer. After the formation of the passivation layer 160, an overcoat layer 170 may be formed to cover the passivation layer 160, wherein the overcoat layer 170 has an opening O2, and the transparent electrode layer 150 on the second portion 144 of the second metal layer 140 is located in the opening O2 of the overcoat layer 170 and the opening O1 of the passivation layer 160. The material of the overcoat layer 170 may be an organic high temperature photoresist, and the overcoat layer 170 may be formed by coating.

Through the aforementioned steps, the thin film transistor array substrate 100 of FIG. 6 can be obtained.

It is to be noted that the connection relationships, the materials, and the advantages of the elements described above will not be repeated in the following description. In the following description, another manufacturing method of the thin film transistor array substrate will be explained.

Figure 7:
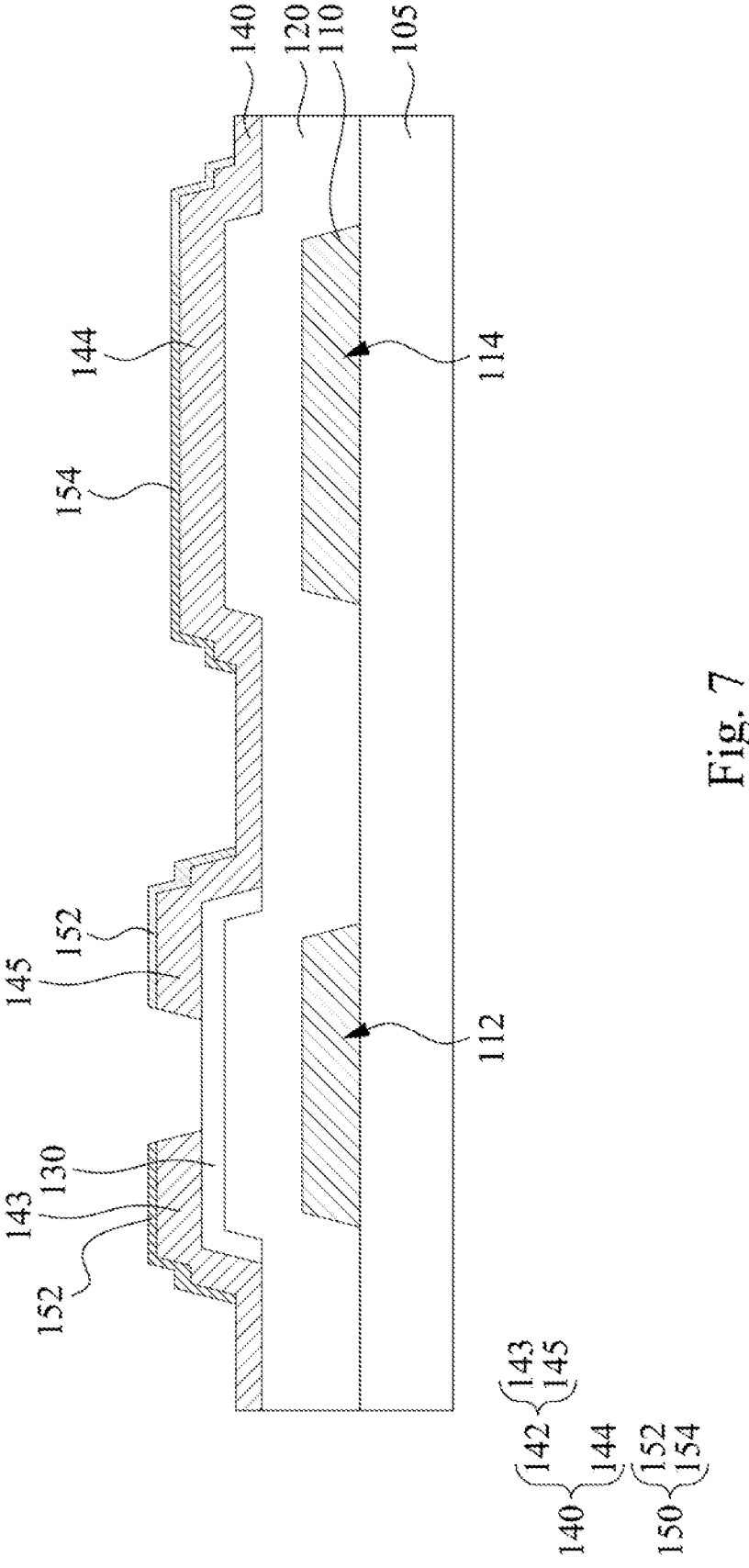
FIGS. 7 and 8 are cross-sectional views at stages of a manufacturing method of a thin film transistor array substrate after FIG. 3 according to another embodiment of the present disclosure.
Figure 8:
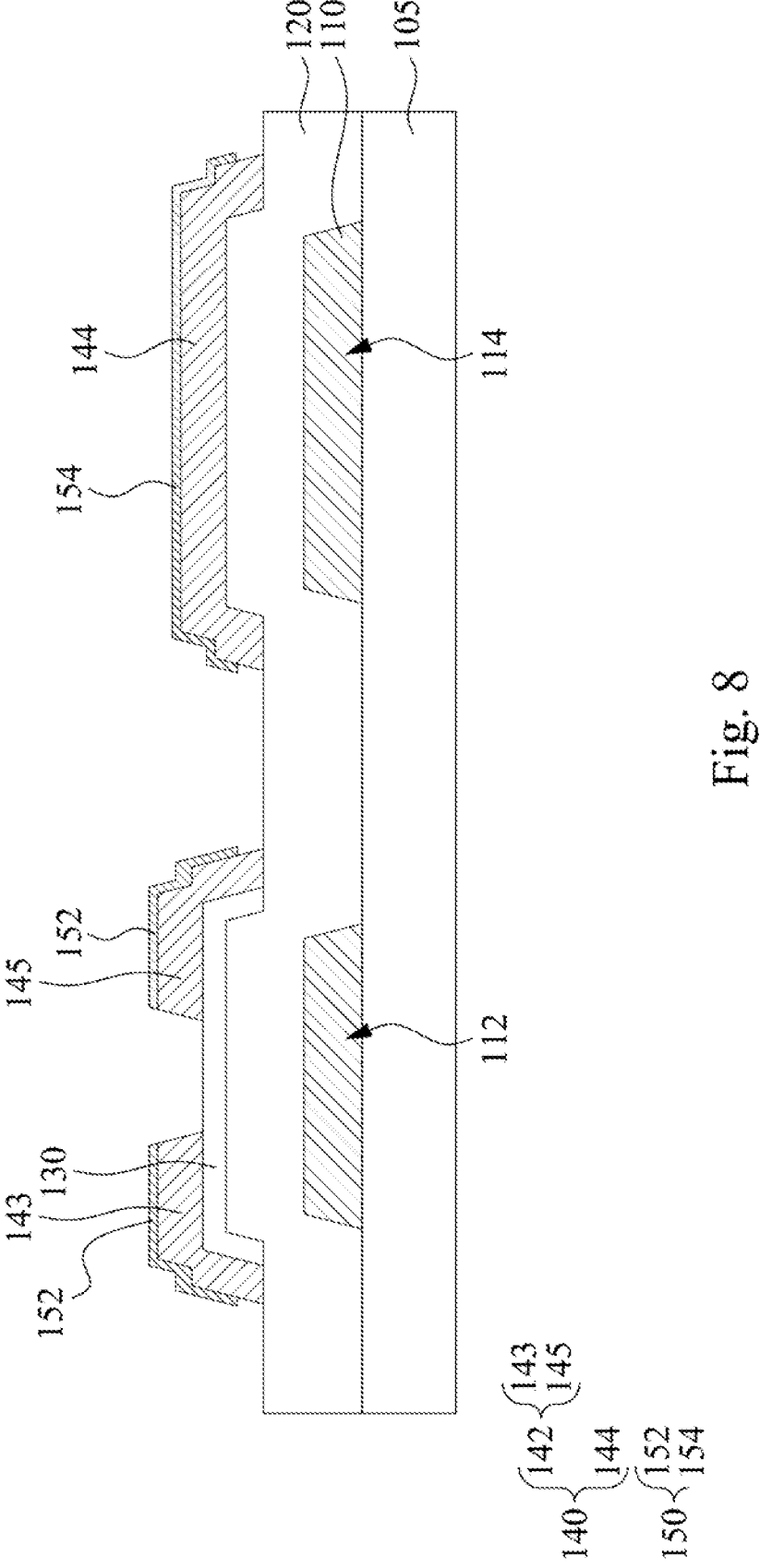

FIGS. 7 and 8 are cross-sectional views at stages of a manufacturing method of the thin film transistor array substrate 100 after FIG. 3 according to another embodiment of the present disclosure. In this embodiment, the manufacturing method has the same steps as the aforementioned description associated with FIG. 2 and FIG. 3, and so a description of these steps will not be repeated. As shown in FIG. 3 and FIG. 7, after the transparent electrode layer 150 is patterned (i.e., after using the photoresist layer P to etch the transparent electrode layer 150), the photoresist layer P is removed. Thereafter, after the removal of the photoresist layer P, a high-temperature crystalizing step is performed. A temperature is increased to crystalize the transparent electrode layer 150, such that the transparent electrode layer 150 has etching and bombardment resistance properties.

As shown in FIG. 8, after the transparent electrode layer 150 is crystalized, the second metal layer 140 may be patterned. In this embodiment, the patterned and crystalized transparent electrode layer 150 can be used to define the pattern of the second metal layer 140 by metal etching, such that the first portion 142 and the second portion 144 of the second metal layer 140 are separated, the first portion 142 of the second metal layer 140 has the two sections 143 and 145 separated from each other, and each of the two sections 143 and 145 extends from the top surface of the semiconductor layer 130 to the top surface of the insulating layer 120 along the sidewall of the semiconductor layer 130.

In this embodiment, since the transparent electrode layer 150 is formed on the second metal layer 140 after the second metal layer 140 is formed on the semiconductor layer 130 and the insulating layer 120, the second metal layer 140 may be patterned by using the patterned transparent electrode layer 150 as a mask. As a result, a reduction of one photomask process (e.g., traditional photo and etching processes for a second metal layer can be omitted) may be realized with the manufacturing method of the thin film transistor array substrate, and moreover, the manufacturing method may be applied to an electronic paper display with lower resolution requirements. In addition, due to the transparent electrode layer 150 having etching and bombardment resistance properties, the transparent electrode layer 150 can further ensure that the second metal layer 140 has a self-alignment effect when being etched, thereby preventing a reduction in size during a metal dry etching process as occurs with the traditional photoresist pattern, and further preventing excessive critical dimension loss (CD loss).

The steps below are similar to the step shown in FIG. 6. After the second metal layer 140 is etched by using the patterned transparent electrode layer 150, the passivation layer 160 and the overcoat layer 170 may be sequentially formed. Through the aforementioned steps, the thin film transistor array substrate 100 of FIG. 6 can be obtained.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A manufacturing method of a thin film transistor array substrate, comprising:

sequentially forming a first metal layer, an insulating layer, and a semiconductor layer on a bottom plate, wherein the first metal layer has a first portion and a second portion, the insulating layer covers the bottom plate and the first metal layer, and the semiconductor layer is located on the insulating layer and overlaps the first portion of the first metal layer;

forming a second metal layer on the semiconductor layer and the insulating layer;

forming a transparent electrode layer on the second metal layer;

patterning the transparent electrode layer such that a first portion of the transparent electrode layer is disposed along a first portion of the second metal layer, and a second portion of the transparent electrode layer is disposed along a second portion of the second metal layer, wherein the second portion of the second metal layer overlaps the second portion of the first metal layer;

patterning the second metal layer; and forming a passivation layer to cover the insulating layer, the second metal layer, and the transparent electrode layer; and etching the passivation layer above the second portion of the second metal layer to form an opening, wherein the second portion of the transparent electrode layer is an etch stop layer.

2. The manufacturing method of the thin film transistor array substrate of claim 1, wherein patterning the transparent electrode layer comprises:

forming a photoresist layer on the transparent electrode layer; and etching, by the photoresist layer, the transparent electrode layer.

3. The manufacturing method of the thin film transistor array substrate of claim 2, wherein patterning the second metal layer comprises:

etching, by the photoresist layer, the second metal layer, such that the first portion and the second portion of the second metal layer are separated from each other, the first portion of the second metal layer has two sections separated from each other, and each of the two sections extends from a top surface of the semiconductor layer to a top surface of the insulating layer along a sidewall of the semiconductor layer.

4. The manufacturing method of the thin film transistor array substrate of claim 3, further comprising:

after etching the second metal layer by the photoresist layer, removing the photoresist layer.

5. The manufacturing method of the thin film transistor array substrate of claim 4, further comprising:

after removing the photoresist layer, increasing a temperature to crystalize the transparent electrode layer.

6. The manufacturing method of the thin film transistor array substrate of claim 2, further comprising:

after etching the transparent electrode layer by the photoresist layer, removing the photoresist layer.

7. The manufacturing method of the thin film transistor array substrate of claim 6, further comprising:

after removing the photoresist layer, increasing a temperature to crystalize the transparent electrode layer.

8. The manufacturing method of the thin film transistor array substrate of claim 7, wherein patterning the second metal layer comprises:

etching, by the crystalized transparent electrode layer, the second metal layer, such that the first portion and the second portion of the second metal layer are separated from each other, the first portion of the second metal layer has two sections separated from each other, and each of the two sections extends from a top surface of the semiconductor layer to a top surface of the insulating layer along a sidewall of the semiconductor layer.

9. The manufacturing method of the thin film transistor array substrate of claim 7, further comprising:

forming an overcoat layer to cover the passivation layer, wherein the overcoat layer has an opening, and the transparent electrode layer on the second portion of the second metal layer is located in the opening of the overcoat layer and the opening of the passivation layer.

* * * * *